United States Patent
Naruse et al.

(10) Patent No.: US 6,765,805 B2
(45) Date of Patent: Jul. 20, 2004

(54) CIRCUIT COMPONENT

(75) Inventors: Takumi Naruse, Miyazaki (JP); Kenichi Kozaki, Miyazaki (JP); Kazuhiro Eguchi, Miyazaki (JP); Katsumi Sasaki, Miyazaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 250 days.

(21) Appl. No.: 09/970,355

(22) Filed: Oct. 3, 2001

(65) Prior Publication Data

US 2002/0105790 A1 Aug. 8, 2002

(30) Foreign Application Priority Data

Oct. 3, 2000 (JP) ....................................... 2000-303369

(51) Int. Cl.[7] .............................. H05K 1/11; H05K 1/14
(52) U.S. Cl. ...................... 361/803; 361/770; 361/774; 361/790
(58) Field of Search .......................... 361/733–735, 361/742, 758, 760–761, 769–774, 782–787, 790, 803, 804, 807, 810–811; 174/260, 262; 257/686–688, 696–698, 723–724

(56) References Cited

U.S. PATENT DOCUMENTS

| | | | | |
|---|---|---|---|---|
| 3,742,309 A | * | 6/1973 | Sterner | 361/790 |
| 3,941,442 A | | 3/1976 | Friend | |
| 4,555,151 A | * | 11/1985 | Neese et al. | 439/82 |
| 4,647,126 A | * | 3/1987 | Sobota, Jr. | 439/74 |
| 4,802,859 A | * | 2/1989 | Gouldy et al. | 439/74 |
| 4,970,577 A | * | 11/1990 | Ogihara et al. | 257/698 |
| 5,191,404 A | * | 3/1993 | Wu et al. | 257/724 |
| 5,239,298 A | * | 8/1993 | Wei | 341/51 |
| 5,406,459 A | * | 4/1995 | Tsukamoto et al. | 361/768 |
| 5,612,512 A | * | 3/1997 | Wakamatsu et al. | 174/260 |
| 5,835,358 A | | 11/1998 | Brakus | |
| 5,969,952 A | * | 10/1999 | Hayashi et al. | 361/774 |
| 5,984,692 A | * | 11/1999 | Kumagai et al. | 439/66 |

FOREIGN PATENT DOCUMENTS

| | | |
|---|---|---|
| DE | 1 837 164 | 9/1961 |
| DE | 41 16 826 | 12/1991 |
| JP | 11-17309 | 1/1999 |
| WO | WO 96/13966 | 5/1996 |

OTHER PUBLICATIONS

German Official Communication dated Aug. 29, 2002.

* cited by examiner

Primary Examiner—David A. Zarneke
Assistant Examiner—Tuan Dinh
(74) Attorney, Agent, or Firm—RatnerPrestia

(57) ABSTRACT

A circuit component comprising a circuit board and a terminal for mounting the circuit board on a second circuit board. A length of the circuit board is 10 mm–80 mm, a difference in a coefficient of thermal expansion between the circuit board and the second circuit board is $0.2 \times 10^{-5}/°$ C. or greater. The terminal is made of an elastic material, and comprised of a first connection section, a second connection section and an elastic section disposed between the first and second connection sections, and the terminal separates the circuit board from the second circuit board by 0.3 mm–5 mm. In the circuit components of the present invention, deterioration in the conduction between the circuit board and the second circuit board due to heat cycles can be prevented. Thus, a circuit component having stable operating characteristics for a long period of time is obtained.

13 Claims, 16 Drawing Sheets

CIRCUIT COMPONENT

FIELD OF THE INVENTION

The present invention relates to a circuit component and a terminal structure thereof, for use in a wireless communication equipment and the like communication apparatus.

DESCRIPTION OF THE PRIOR ART

A conventional circuit component and its terminal structure is described in the following using a dielectric filter as an example. FIG. 22 and FIG. 23 show perspective views of a conventional dielectric filter.

Referring to FIG. 23 and FIG. 24, a conventional dielectric filter comprises a coupling board 3 having electrodes formed thereon, a plurality of resonators 5, center conductors 6 and shield covers 7. A circuit board 1 is provided with a grounding pattern and other electrode patterns, which are not shown in the drawing. Also, chip components 2 are mounted on the circuit board 1.

The coupling board 3 is mounted on the circuit board 1 via a spacer 4. The coupling board 3 is provided on the upper and the bottom surfaces with independent electrodes.

A generally-used resonator 5 comprises a dielectric substance provided with a through hole, the surface, including that of the through hole, of the dielectric substance is covered with a conductive layer. Each of the plurality of resonators 5 has a center conductor 6 provided in the through hole, and being coupled with the conductive layer, and the center conductor 6 is connected to respective independent electrodes provided on the coupling board 3. The plurality of resonators 5 are capacity-coupled. The shield cover 7 is attached on the circuit board 1 covering the resonators 5 in the transmittance side and the receiving side, respectively.

The dielectric filter structured as described above is mounted on a circuit board 1 via a spacer 4, and an air gap is provided between the coupling board 3 and the circuit board 1. The air gap reduces a stray capacitance between the coupling board 3 and the circuit board 1. In this way, a change or a dispersion in the characteristics due to a substantial stray capacitance, that could be generated when the coupling board 3 is mounted directly on the circuit board 1, can be suppressed.

In the above-described conventional structure, however, there exists a substantial difference in a coefficient of thermal expansion between the circuit board 1, which is generally made mainly of an epoxy-glass substrate, and the coupling board 3, which is generally made mainly of alumina or the like ceramic material. The difference in the coefficients of thermal expansion creates a substantial stress in a material (a solder, for example) coupling the spacer 4 and the electrode, resulting in micro-cracks or the like problems in the coupling material and causes an electrical connection trouble between the coupling board 3 and the circuit board 1. This is a deteriorating factor in the characteristics.

The spacers 4 of high rigidity were conventionally used, which include a square metal column, a ceramic material covered with a conductive layer, as illustrated in FIG. 25.

SUMMARY OF THE INVENTION

A circuit component of the present invention comprises a circuit board (joint circuit board) provided with circuit patterns and terminals for mounting the circuit board on a second circuit board, length of the circuit board being 10 mm–80 mm long. Difference in coefficient of thermal expansion between the circuit board and the second circuit board is $0.2 \times 10^{-5}/°$ C. or more. The terminal is made of an elastic material, and separates the circuit board from the second circuit board for 0.3 mm–5 mm. The terminal comprises a first connection section, a second connection section, and an elastic section disposed between the first and the second connection sections.

At least one of the connection sections of the terminal in an exemplary embodiment of the present invention is provided with a plurality of connection sections, or a connection section is branching out to form a plurality of connection sections. The plurality of branched connection sections is provided at the end with a bent section, or a protrusion.

A structure in accordance with the present invention is advantageous in preventing a possible deterioration in the electrical conduction between the second circuit board and the joint circuit board which would be caused by repeated heat cycles. Thus the present invention offers a circuit component that provides stable operating characteristics for a long operating period.

DESCRIPTION OF THE PREFERRED EMBODIMENTS

First Embodiment

Description is made in the following using a dielectric filter as an example for the circuit component of the present invention.

Figure 1:
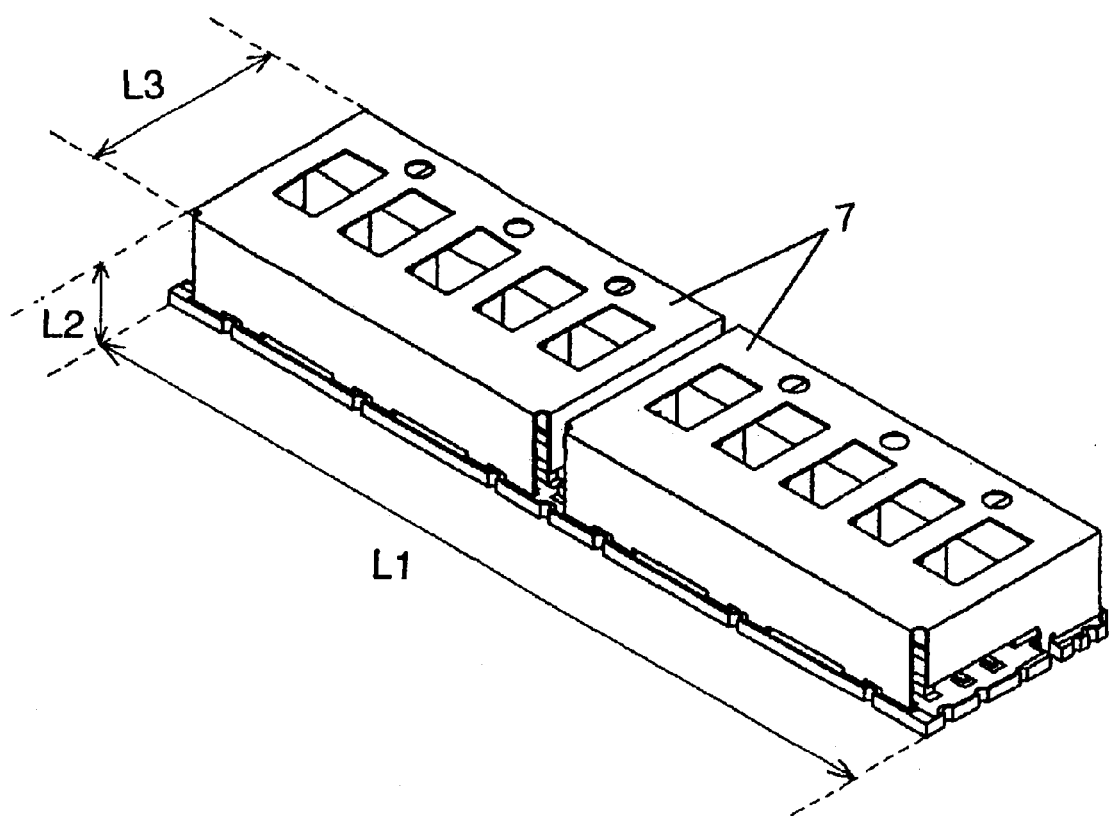
FIG. 1 is a perspective view of a dielectric filter in accordance with an exemplary embodiment of the present invention.
Figure 2:
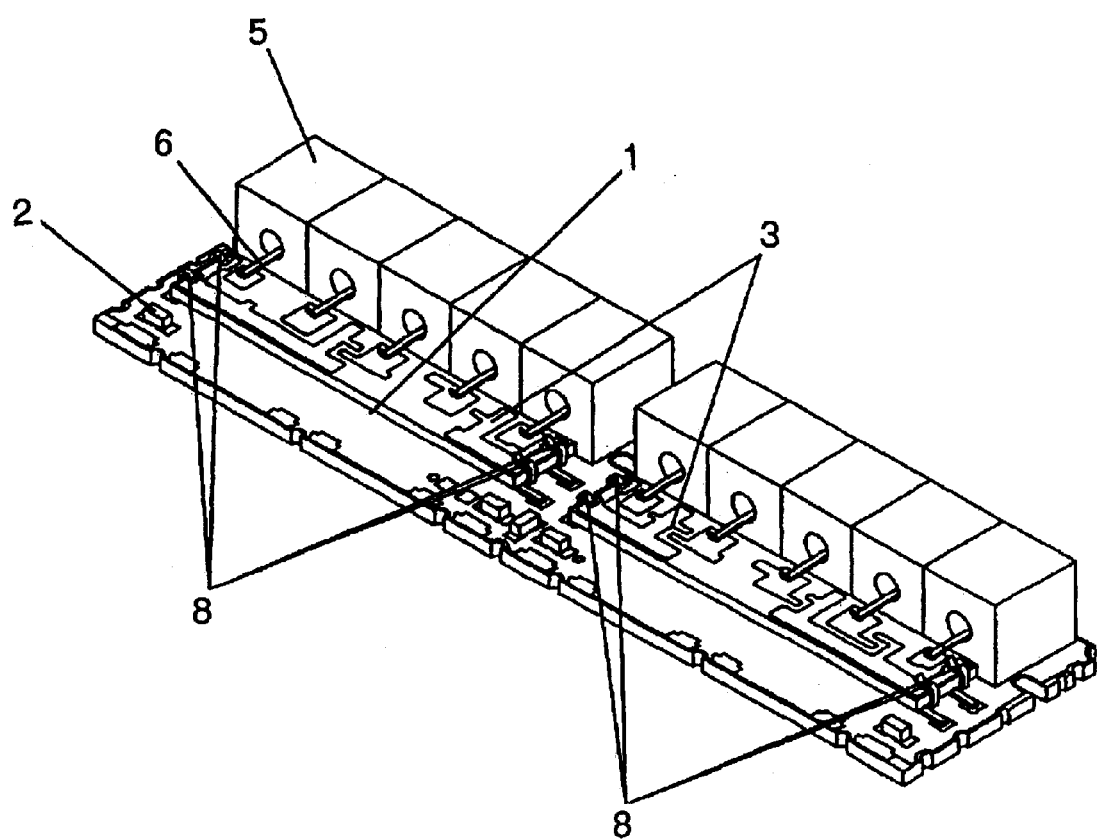
FIG. 2 is a perspective view of a dielectric filter in accordance with an exemplary embodiment of the present invention.

FIGS. 1 and 2 show perspective views, respectively, of a dielectric filter in accordance with a first exemplary embodiment of the present invention.

Referring to FIGS. 1 and 2, a dielectric filter of the present invention comprises a circuit board 1, a chip component 2, a coupling board 3, a resonator 5, a center conductor 6 and a shield case 7. These items have similar structures as those in the conventional dielectric filter.

The dielectric filter of the present invention is provided with terminals 8 for mounting the coupling board 3 on the circuit board 1. The conventional spacers 4 are replaced with terminals 8.

The terminal 8 is made of a plate-form material, such as phosphor bronze, brass, beryllium copper, stainless steel, nickel-plated steel or aluminum or the like, by machining it through a bending or punching process. Thus, the terminal 8 is rich in the elastic property. It is preferred that, in view of great advantages in the manufacturing process and other factors, the terminal 8 is made by bending a sheet of one of the above-described metals. Preferred thickness of the metal sheet is 0.1 mm–0.5 mm (more preferably 0.1 mm–0.3 mm). The metal sheets thinner than 0.1 mm are poor in the mechanical strength; as a result, even a small external force can make a terminal 8 deformed, or machining difficulties would arise. On the other hand, the metal sheets thicker than 0.5 mm will have too much rigidity, which would have the same problem as observed in the conventional dielectric filters.

The terminal 8 should preferably be provided on the surface with an under-layer and a junction layer formed on the under-layer. A preferred material for the under-layer is copper, copper alloy, nickel or nickel alloy, and thickness of the layer is 1–5 $\mu$m, to prevent the solder leaching (or similar problems). The under-layers thinner than 1 $\mu$m are not effective to prevent the solder leaching, while the layers thicker than 5 $\mu$m are too thick to make a terminal 8 compact-shaped.

A preferred material for the junction layer, which is intended to work when a terminal 8 is mounted on a circuit board 1, is solder, lead-free solder (a bonding material of, for example, Sn, or Sn containing at least one element among the group of Ag, Cu, Zn, Bi and In), gold, or an alloy containing gold. The junction layer should preferably has a thickness 2–12 $\mu$m. The junction layers thinner than 2 $\mu$m are insufficient to be a junction layer, while the layers thicker than 12 $\mu$m are too thick to make a terminal 8 compact-shaped.

Although the terminal 8 in the present embodiment is provided with both the under-layer and the junction layer, either one of the layers, the under-layer or the junction layer, may be provided on the surface, depending on the situation. Or, depending on product specifications or the like, both of the layers may be eliminated.

Figure 3:
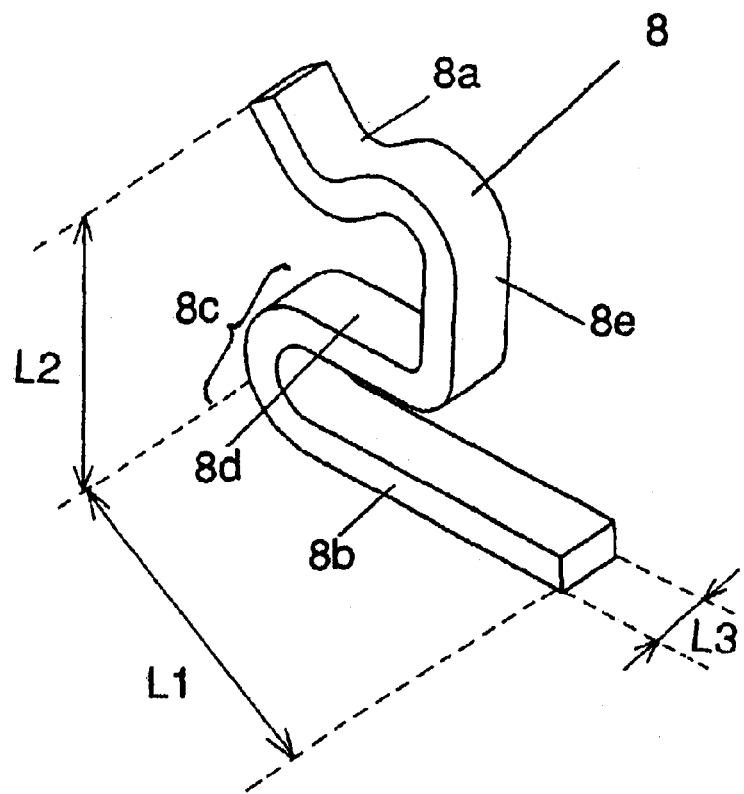
FIG. 3 is a perspective view of a terminal of a dielectric filter in accordance with an exemplary embodiment of the present invention.
Figure 4:
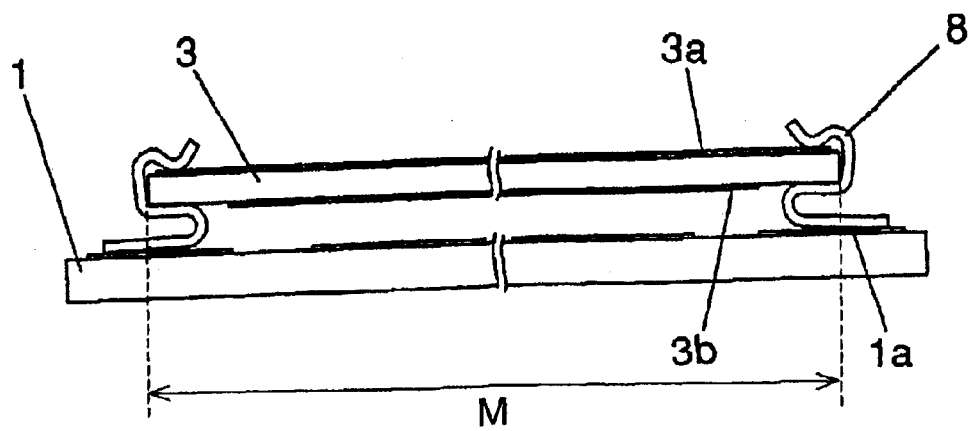
FIG. 4 is a side view of a dielectric filter in accordance with an exemplary embodiment of the present invention.
Figure 5:
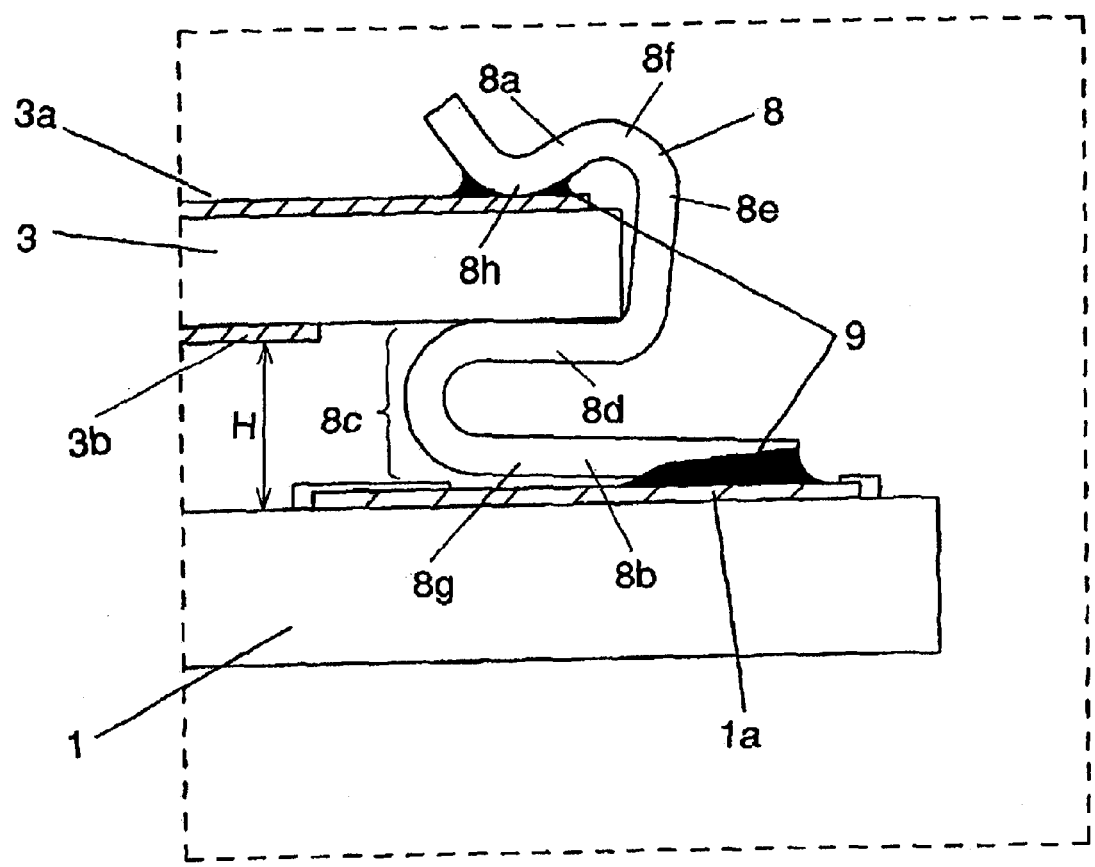
FIG. 5 is a partial side view of a dielectric filter in accordance with an exemplary embodiment of the present invention.

The terminal 8 is shaped in the form of a letter S, as shown in FIGS. 3, 4 and 5. It comprises a connection section 8a which makes electrical or mechanical contact with a surface electrode 3a of the coupling board 3, a connection section 8b which makes electrical or mechanical contact with an electrode 1a of the circuit board 1, and an elastic section 8c locating between the connection section 8a and the connection section 8b.

The terminal 8 is further provided with an opposing section 8d opposing to the connection section 8a, and a joint section 8e joining the connection section 8a and the opposing section 8d. The connection section 8a, the joint section 8e and the opposing section 8d constitute a holding section, which is formed in the shape of a letter C for elastically holding the coupling board 3. Although the terminal in the present embodiment is designed so that the holding section holds the coupling board 3 elastically, it may be designed instead that a gap between the opposing section 8d and the connection section 8a is greater than the thickness of the coupling board 3 so that a coupling board 3 can be simply inserted in between.

As shown in FIG. 5, the connection section 8a and the connection section 8b are making contact, respectively, with a surface electrode 3a of the coupling board 3 and an electrode 1a of the circuit board directly or an indirectly. And they are connected mechanically and electrically by a solder, a lead-free solder or the like bonding material 9. The elastic section 8c is disposed to be locating between the circuit board 1 and the coupling board 3, as shown in FIG. 4 and FIG. 5. In the above-described structure, even if a stress is applied on the terminal 8 due to difference in the coefficient of the thermal expansion between the circuit board 1 and the coupling board 3, most of the stress is absorbed by the elastic section 8c. As the result, the stress does not concentrate to the bonding material 9, and generation of micro-cracks in the bonding material 9 can be reduced.

Figure 6:
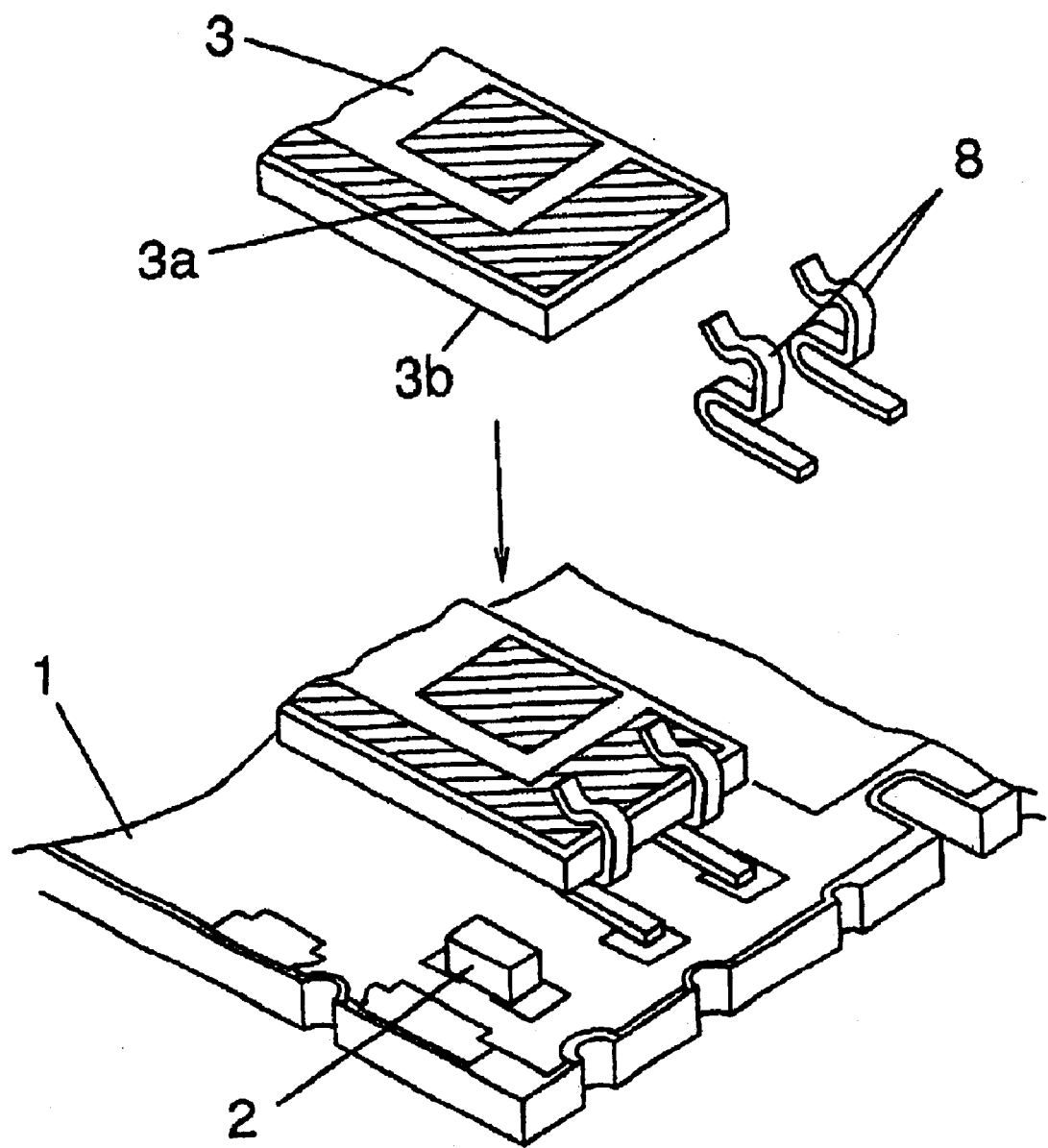
FIG. 6 is a perspective view of a dielectric filter in accordance with an exemplary embodiment of the present invention.

A circuit component of the present invention is assembled in a procedure as shown in FIG. 6. In the first place, two pieces of terminals 8 are attached to one side edge of the coupling board 3, by inserting the side edge to the holding section of the terminal 8. Since the holding section of the terminal 8 elastically holds the coupling board 3, as described earlier, the terminals 8 can be fixed provisionally to the coupling board 3.

Then, by providing a bonding material 9 bridging the terminal 8 and the surface electrode 3a, and heating them together, the coupling board 3 and the terminal 8 can be fixed together, both electrically and mechanically. For the sake of operational efficiency, the bonding material 9 may be applied on a predetermined portion of the surface electrode 3a before the terminal 8 is attached thereto, and then the terminal 8 is attached and heated for the electrical and mechanical connection on the coupling board 3.

Next, the coupling board 3 having the terminals 8 are placed on the circuit board 1, with the connection section 8b of terminal 8 making a direct or an indirect contact to the electrode 1a of the circuit board 1. And then the coupling board 3 is mounted and fixed to the circuit board 1 electrically and mechanically using a bonding material 9.

Another exemplary means for reducing a stress to be effected on the bonding material 9 is shown in FIG. 5. The connection section 8a is provided with a protruding section 8h protruding towards the opposing section 8d. In this way, the holding section can easily have a holding force for holding a coupling board 3. By limiting the application of a bonding material 9 only to the protruding section 8h and the vicinity, another stress-reducing corner 8f can be formed between the joint section 8e and the connection section 8a.

The protruding section 8h contributes also to ensure the contact between a surface electrode 3a and the connection section 8a, preventing a possible contact trouble.

Also at the connection section 8b, further stress-reducing means can be implemented. Namely, by connecting the connection section 8b with an electrode 1a of circuit board 1 only at the end part of the connection section 8b by applying a bonding material 9 only at the end part of the connection section 8b, a flat flexion section 8g is provided in the connection section 8b. A stress can be reduced further by the flexion section 8g.

Figure 7:
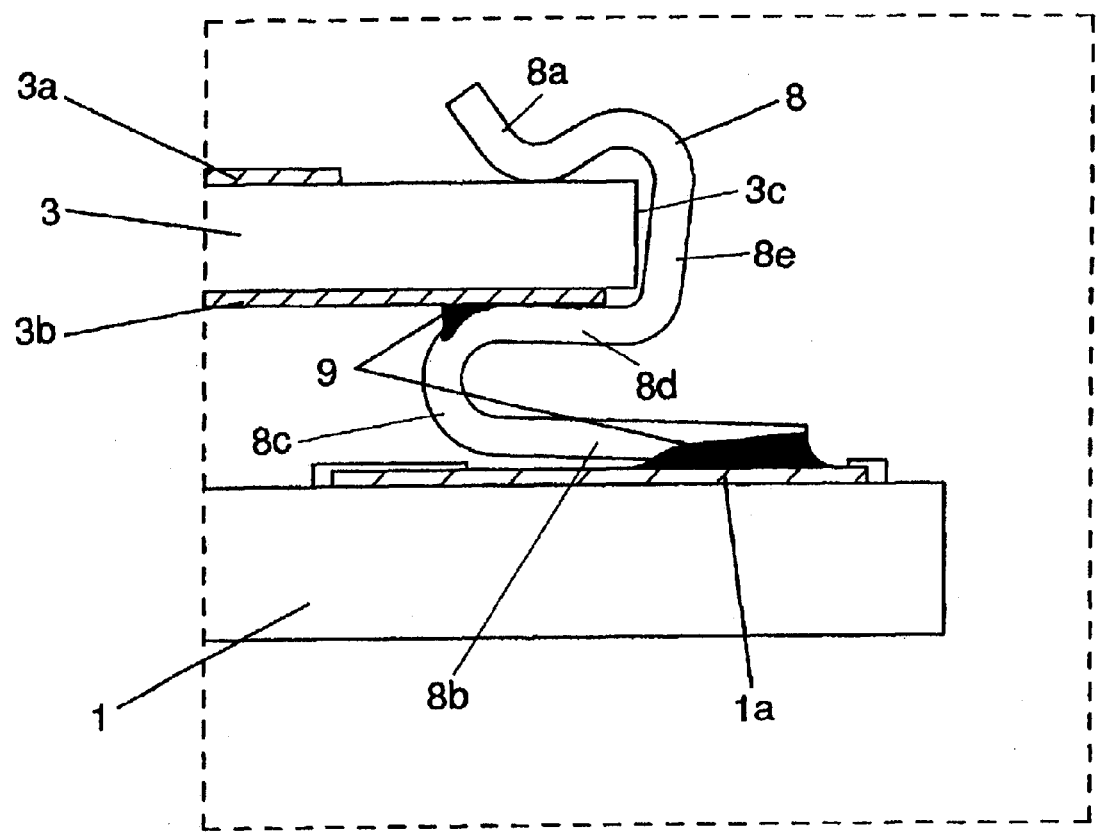
FIG. 7 is a partial side view of a dielectric filter in accordance with an exemplary embodiment of the present invention.

Still another structural example of the present embodiment is shown in FIG. 7. There is no electrical contact between the connection section 8a and a surface electrode 3a, while the opposing section 8d is connected both electrically and mechanically to a reverse-surface electrode 3b with a bonding material 9.

The structure of FIG. 7 may be considered as an inverse version of the roles performed by the connection section 8a and the opposing section 8d shown in FIG. 5.

Although in the examples in the present embodiment either one among the connection section 8a and the opposing section 8d is making contact with a surface electrode 3a or a reverse-surface electrode 3b of the coupling board 3, both of the connection section 8a and the opposing section 8d may be connected to a surface electrode 3a and a reverse-surface electrode 3b.

Besides the above-described ways of connection illustrated in the drawings, there can be another way of connection. Namely, an end face electrode is provided on the end face 3c of coupling board 3 by extending a surface electrode 3a, or a reverse-surface electrode 3b, and then the end face electrode may be connected to the joint section 8e using a bonding material 9. In other words, depending on the layout pattern of electrodes, there can be another way of connection, where at least one of the connection section 8a, the opposing section 8d and the joint section 8e makes contact with the coupling board 3.

Although in the examples shown in FIG. 1–FIG. 7 one side edge of the coupling board 3 has been provided with a couple of terminals 8, or a coupling board 3 has been mounted on a circuit board 1 using four terminals 8, one, three or more terminals 8 may be attached to the coupling board 3 at one side edge. However, the number of terminals 8 should preferably be five or less. A high count of terminals 8 means an increased number of process steps in assembly operation, which impairs the manufacturing productivity. It is preferable that a coupling board 3 is attached with a plurality of terminals 8 for one side edge when it is mounted on a circuit board 1. By so doing, a coupling board 3 is supported on a circuit board 1 at a plurality of points; thus an electronic component can be mounted stable on a circuit board, and the manufacturing productivity is improved.

In view of downsizing of an electronic apparatus and assurance of the physical strength, it is preferable to maintain the dimensions of the terminal 8 to satisfy the following requirements: where, L1 represents a length, L2 a height and L3 a width of a terminal 8 as is shown in FIG. 3.

$$3 \text{ mm} \geq L1 \geq 1 \text{ mm}$$

$$6 \text{ mm} \geq L2 \geq 1 \text{ mm}$$

$$3 \text{ mm} \geq L3 \geq 0.4 \text{ mm}$$

It is preferred to keep a gap H between a circuit board 1 and a coupling board 3 shown in FIG. 5 within a range of 0.3 mm–5 mm (more preferably, 0.5 mm–2 mm). If the gap H is narrower than 0.3 mm, the stray capacitance of the coupling board 3 relative to the circuit board 1 becomes large and characteristics of an electronic circuit tend to change easily. On the other hand, the gap H greater than 5 mm makes height of a dielectric filter itself great, that does not fit to the downsizing objective for an electronic apparatus.

A terminal 8 in accordance with the present embodiment is especially advantageous in a case where difference in the coefficient of thermal expansion between the circuit board 1 and the coupling board 3 is $0.2 \times 10^{-5} /°$ C., or more. Furthermore, the length M of a coupling board 3 shown in FIG. 4 is quite relevant to its thermal expansion. The longer the length M of coupling board 3, the greater the change in length caused by thermal expansion. It is especially preferable to use a terminal 8 of the above-described configuration in a case where length M of the coupling board 3 is within a range of 10 mm–80 mm. When the length M is shorter than 10 mm, change in the length caused by thermal expansion of joint circuit board would be so small, staying within a nominal value, and there would be only a small stress generated between the coupling board 3 and the circuit board 1. On the other hand, a length M greater than 80 mm leads to a bulky-sized dielectric filter, which is not suitable to the downsizing objective for an electronic apparatus.

The above-described examples have been put into heat cycle tests to have the advantages confirmed. Practical test results are described below.

Figure 25:
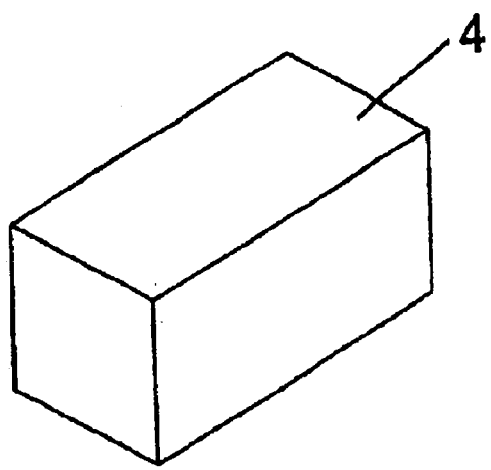
FIG. 25 is a perspective view showing a spacer for a conventional dielectric filter.

For the comparison, dielectric filter samples of conventional technology were manufactured using a spacer 4 shown in FIG. 25 for coupling a circuit board and a joint circuit board. Example 1 is dielectric filters having the connecting structure shown in FIG. 5. Example 2 is dielectric filters having the connecting structure shown in FIG. 7.

The coupling board 3 of each of the samples is made of a 96% alumina, and the circuit board 1 is made of an epoxy-glass substrate.

In the heat cycle test, the samples are kept at 85° C. for 30 minutes and then the temperature is lowered to −40° C. and kept at the temperature for 30 minutes, viz. one heat cycle takes 1 hour.

20 samples were provided for each category. As shown in FIG. 2 and other figures, there are two joint circuit boards in a dielectric filter (antenna duplexer). In the conventional technology, one joint circuit board employs two spacers 4; hence, number of spacers 4 are 80 among the 20 dielectric filter samples. In the dielectric filters of examples 1 and 2, one joint circuit board employs four terminals 8. Or, there are eight terminals 8 in each of the dielectric filter samples; hence, number of the terminals 8 are 160 among the 20 dielectric filter samples.

After conducting the heat cycle test for a certain predetermined cycles, the dielectric filter samples were visually inspected using an optical microscope of 100 magnification, for counting number of the spacers 4, or the terminals 8, having a crack in the bonding material. The results are shown in Table 1.

TABLE 1

|  | numbers of heat cycles | | | | | | | |
| --- | --- | --- | --- | --- | --- | --- | --- | --- |
|  | 20 | 50 | 100 | 300 | 500 | 800 | 1000 | 1200 |
| Comparative Ex. | 0 | 0 | 0 | 1 | 4 | 9 | 20 | 30 |
| Example 1 | 0 | 0 | 0 | 0 | 0 | 0 | 0 | 1 |
| Example 2 | 0 | 0 | 0 | 0 | 0 | 1 | 2 | 4 |

Table 1 shows that, the conventional dielectric filter starts cracking at 300 cycles. Whereas, no crack is observed among Example 1 and Example 2.

After 1200 cycles, the conventional dielectric filter shows crack at the bonding material of the spacer for as many as 30 pieces, while the crack is observed in 1 piece and 4 pieces, respectively, among the Example 1 and the Example 2. Thus it has been confirmed that use of the terminal 8 of the present invention provides superior results. Furthermore, it has to be noted that number of terminals 8 among each of the Example 1 and the Example 2 is twice as much as the comparative example. Despite double number of the terminals existing in each of the Example 1 and the Example 2, number of the cracks observed are significantly small. Thus, it has become obvious that a structure employing the terminal 8 of the present invention is advantageous in the heat cycle test.

Second Embodiment

A second exemplary embodiment of the present invention is described with reference to FIG. 8 and FIG. 9.

The difference with the structure of FIG. 3 is that a terminal 8 in the present embodiment has a T-shaped form at the connection section 8b. Or, the end of connection section 8b is branched towards opposite directions, and each end part of the branch makes contact with electrode 1a of the circuit board 1.

Figure 8:
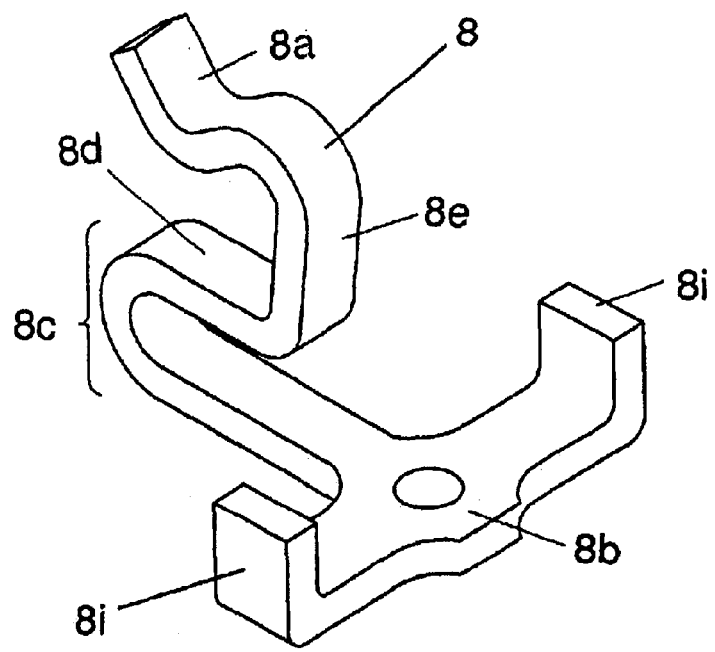
FIG. 8 is a perspective view of a terminal of a dielectric filter in accordance with another exemplary embodiment of the present invention.

It is preferred that respective ends of the branched connection section 8b are provided with a bent section 8i, as shown in FIG. 8. When a terminal 8 is connected to an electrode 1a using a bonding material 9, the bent section 8i helps the bonding material 9 form a fillet along the side face of bent section, preventing it from spreading over the electrode 1a. As a result, the area of bonding material 9 can be limited to be small.

In place of the above-described bent section, a protrusion may be provided at the end of the branched connection section 8b.

Figure 9:
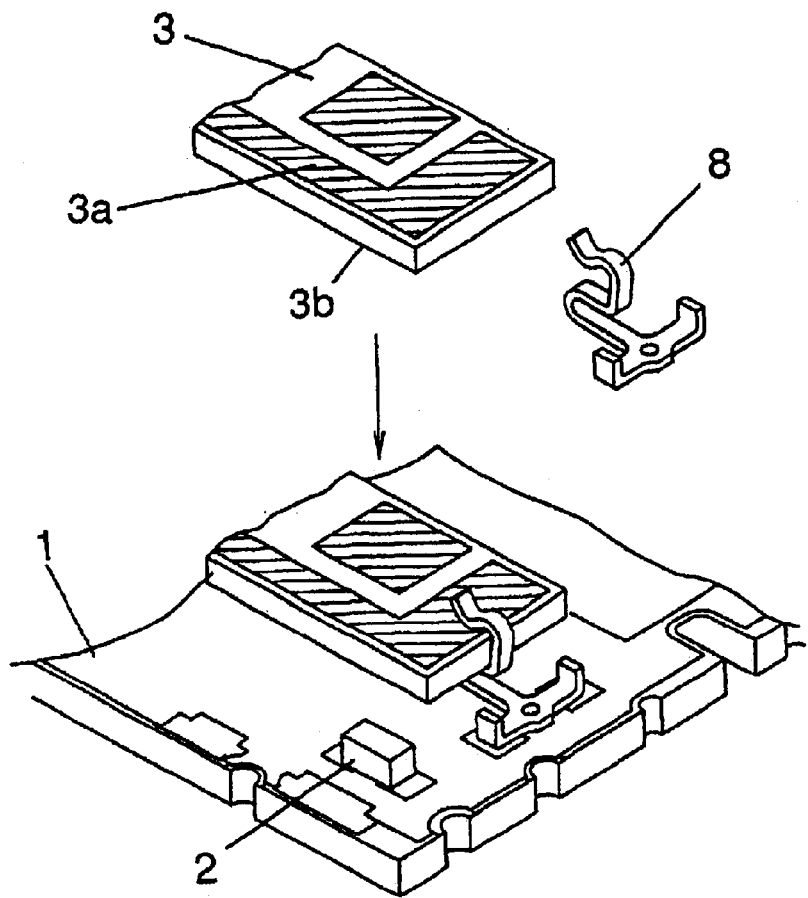
FIG. 9 is a perspective view of a dielectric filter in accordance with another exemplary embodiment of the present invention.

Advantage of a terminal of the present embodiment, whose end at the connection section 8b is divided into two, is that, for example, in a case where an electrode 1a of circuit board is split into two as shown in FIG. 9 and a terminal 8 is to be connected to each of the split electrodes 1a, the terminal 8 can be easily connected to the electrodes 1a. As a result, the number of terminals 8 to be connected can be reduced, which results in a smaller number of constituent components. Another advantage with the terminal in the present embodiment is that area of connection formed between a terminal 8 and a circuit board 1 is increased, and the mounting stability of components is improved, which leads to an improved manufacturing productivity.

Although the connection section 8b has been split into the form of a letter T in the present embodiment, it may be split into other shapes, into the form of a letter Y, for example. The connection section 8b may be split into two or more branches for the same effect.

Third Embodiment

A third exemplary embodiment of the present invention is described with reference to the drawings FIG. 10 and FIG. 11.

Figure 10:
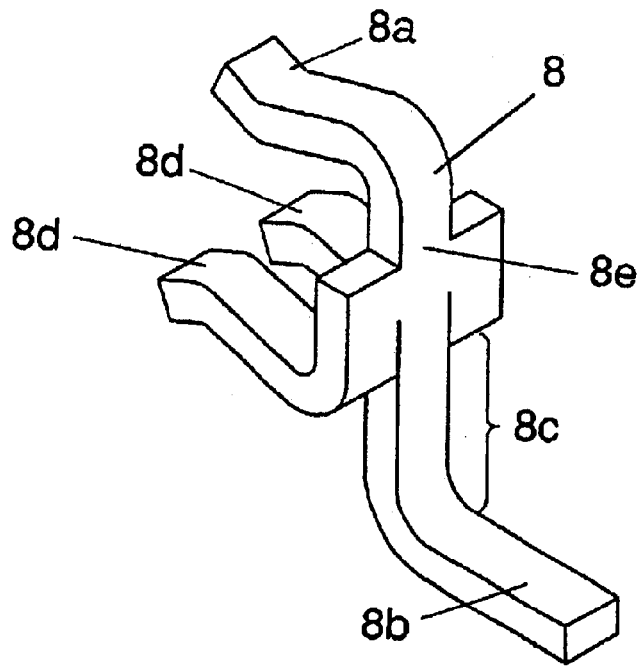
FIG. 10 is a perspective view of a terminal of a dielectric filter in accordance with yet another exemplary embodiment of the present invention.
Figure 11:
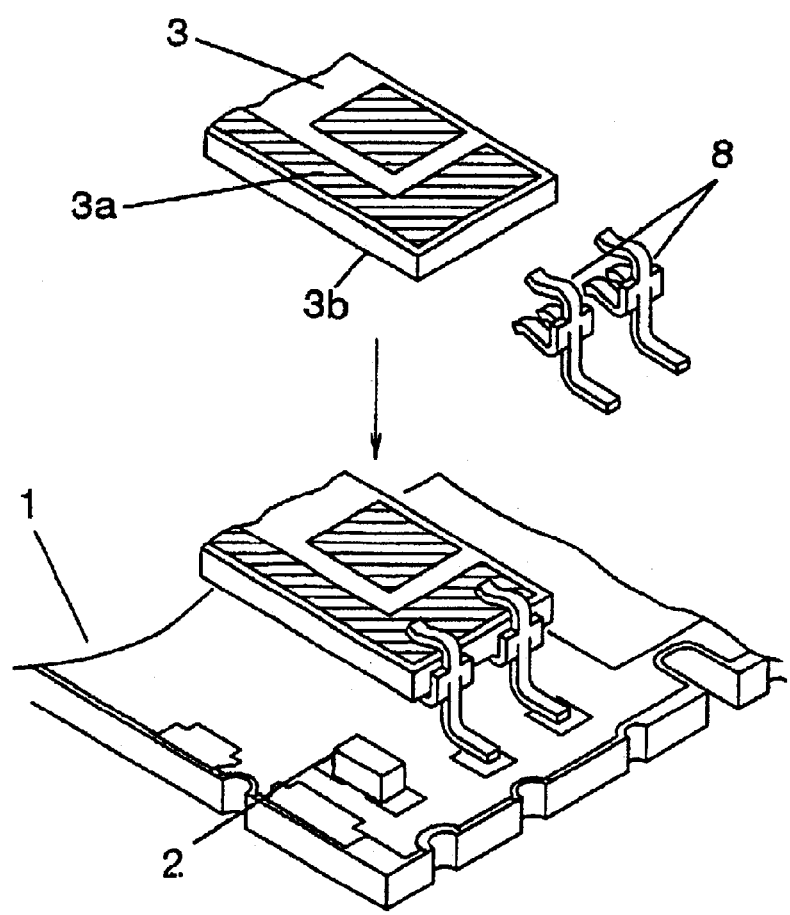
FIG. 11 is a perspective view of a dielectric filter in accordance with yet another exemplary embodiment of the present invention.

Referring to FIG. 10 and FIG. 11, a terminal 8 is provided with one connection section 8a, which is stretching from the joint section 8e, and a pair of opposing sections 8d stretching from the joint section 8e to oppose the connection section 8a. Namely, the terminal 8 in the present embodiment is based on the structure of FIG. 3, and is provided with an increased number of opposing sections 8d, the connection section 8a is being disposed to be locating above the clearance formed by the pair of the opposing sections 8d.

In the configuration of FIG. 3, part of the elastic section 8c is utilized to work also as the opposing section 8d. So, the elastic section 8c has a curved form. On the other hand, the elastic section 8c in the present embodiment is straight-formed, as shown in FIG. 10 and FIG. 11, and the elastic section 8c and the connection section 8b form the approximate shape of a letter L.

The elastic section 8c of terminal 8 of FIG. 3 comes underneath a coupling board 3 as shown in FIG. 5 and other drawings. However, the elastic section 8c of a terminal 8 configured as shown in FIG. 10 comes at a side of the coupling board 3. Thus the terminal 8 in the present embodiment as illustrated in FIG. 10 and FIG. 11 reveals its advantage in a case where a space between a circuit board 1 and a coupling board 3 is unable to accept the elastic section 8c by some reason.

Furthermore, the terminal 8 of the present configuration can support or hold a coupling board 3 in a more reliable manner, as compared with the case of FIG. 3, in which there is only one opposing section 8d. Thus, the coupling board 3 and the terminal 8 are more easily attached.

Figure 12A:
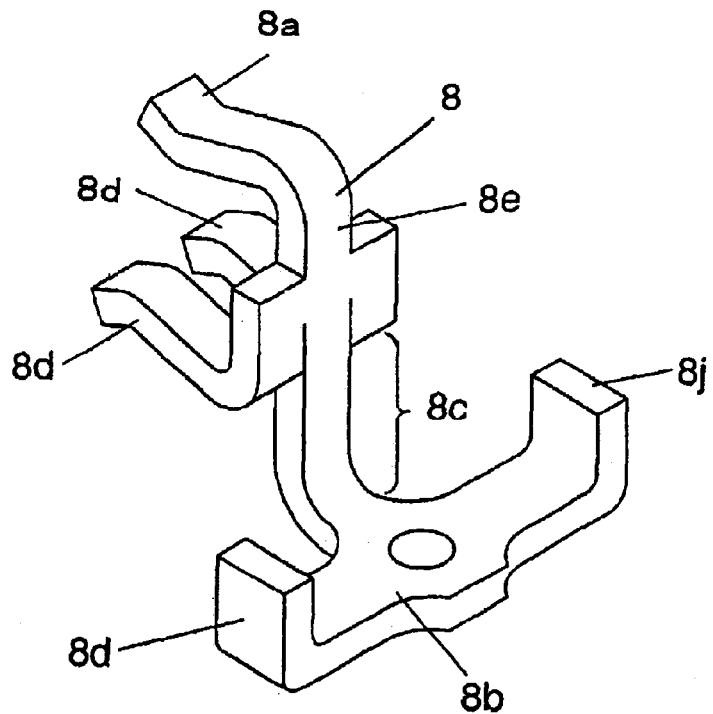
FIG. 12(a) is a perspective view of a terminal of a dielectric filter in accordance with still another exemplary embodiment of the present invention.
Figure 12B:
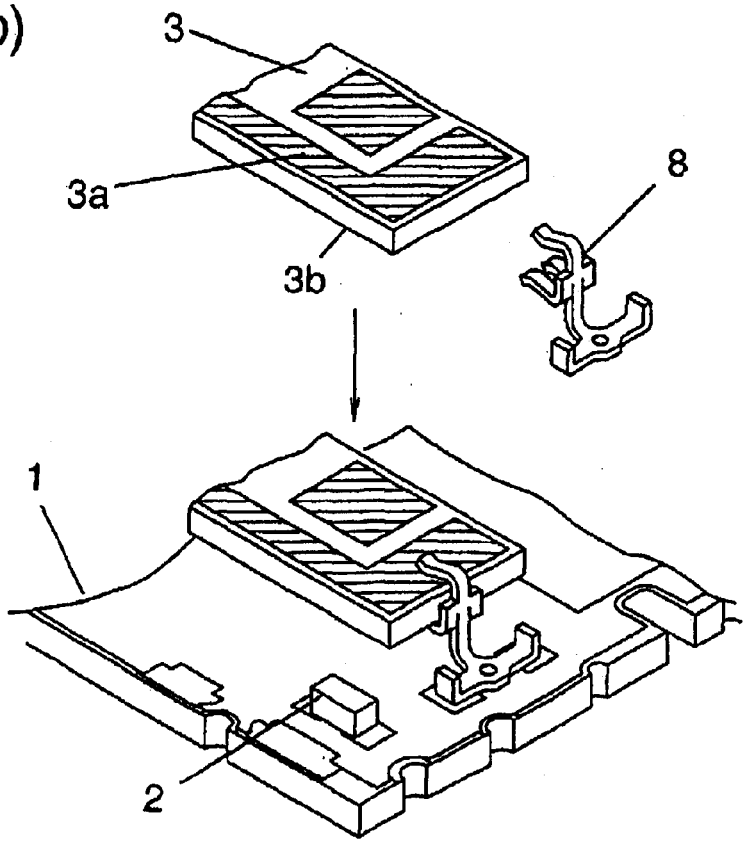
FIG. 12(b) is a perspective view of a dielectric filter in accordance with still another exemplary embodiment of the present invention.

Although the terminal of the present embodiment has two opposing sections 8d and one connection section 8a, the terminal may have three or more opposing sections 8d, and two or more connection sections 8a. Furthermore, it may have two or more connection sections 8a, while number of the opposing section 8d is remained to be one. Still another example of the terminal may be configured in a structure as illustrated in FIGS. 12(*a*) and 12(*b*), where a terminal 8 of FIG. 10 is provided at the connection section 8b with a branch configuration like that shown in FIG. 8.

Fourth Embodiment

Figure 13:
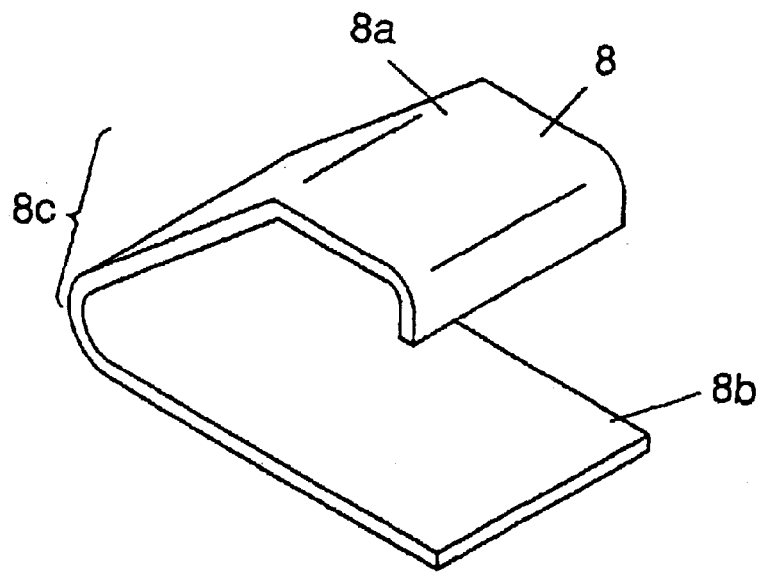
FIG. 13 is a perspective view of a terminal of a dielectric filter in accordance with another exemplary embodiment of the present invention.
Figure 14:
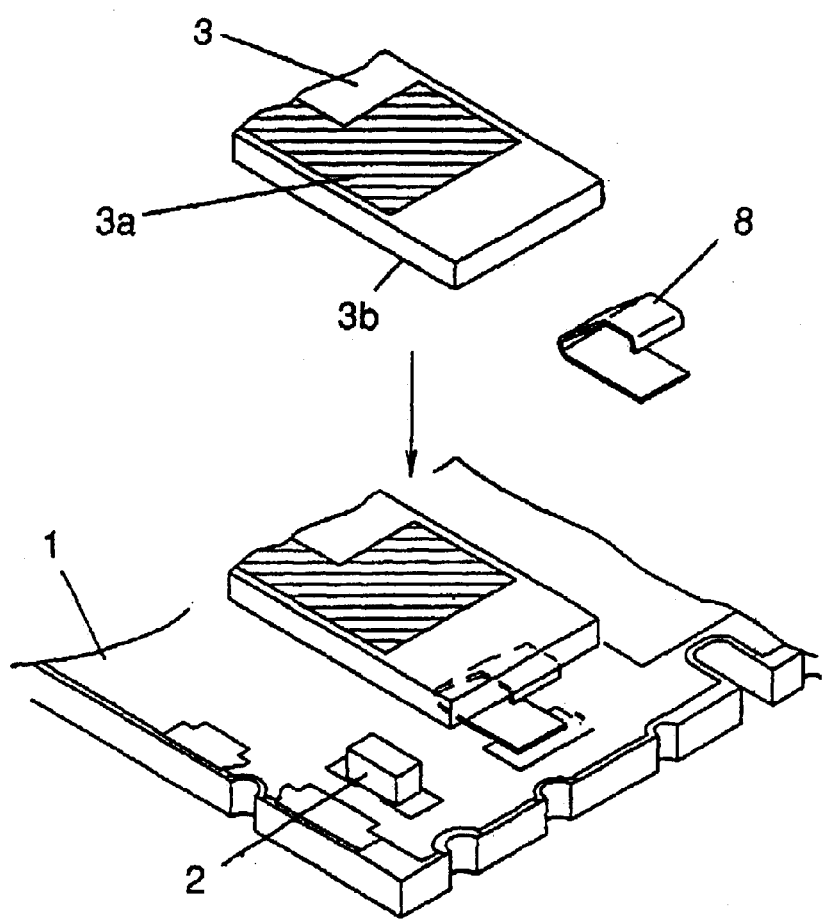
FIG. 14 is a perspective view of a dielectric filter in accordance with another exemplary embodiment of the present invention.
Figure 15:
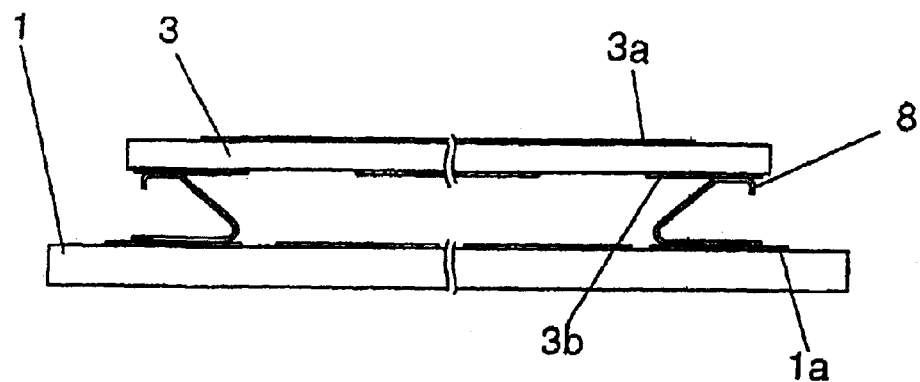
FIG. 15 is a side view of a dielectric filter in accordance with another exemplary embodiment of the present invention.

A fourth exemplary embodiment of the present invention is described referring to FIG. 13 through FIG. 15.

The terminal 8 in the present embodiment comprises an elastic section 8c disposed between the connection section 8a and the connection section 8b. The present terminal 8 is not designed to hold a coupling board 3. The end portion of the connection section 8a is bent inward towards the connection section 8b so that it does not damage the electrodes and other elements.

In a terminal 8 of the present embodiment, the connection section 8a and the connection section 8b are disposed substantially in parallel to each other, and the elastic section 8c is disposed slant to the connection sections 8a and 8b.

The connection section 8a is attached to an electrode disposed on the reverse-surface of the coupling board 3, while the connection section 8b is attached to the electrode 1a disposed on the circuit board 1. The terminals 8 provides an effective elastic property when they are disposed in an arrangement as illustrated in FIG. 15, where the slant elastic sections 8c oppose to each other (the connection sections 8a, 8b of both terminals facing outward with respect to a coupling board 3).

Fifth Embodiment

Figure 16:
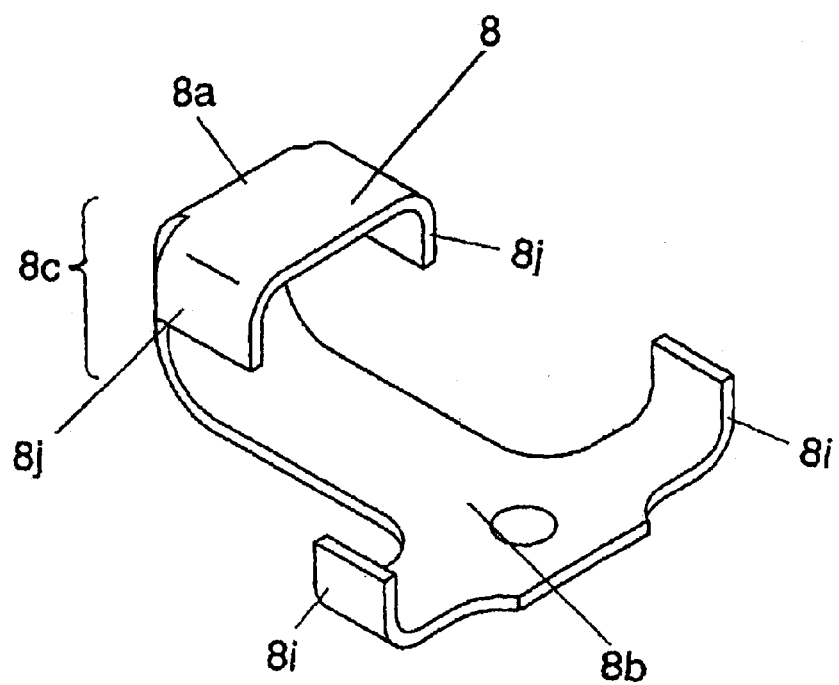
FIG. 16 is a perspective view of a terminal of a dielectric filter in accordance with another exemplary embodiment of the present invention.
Figure 17:
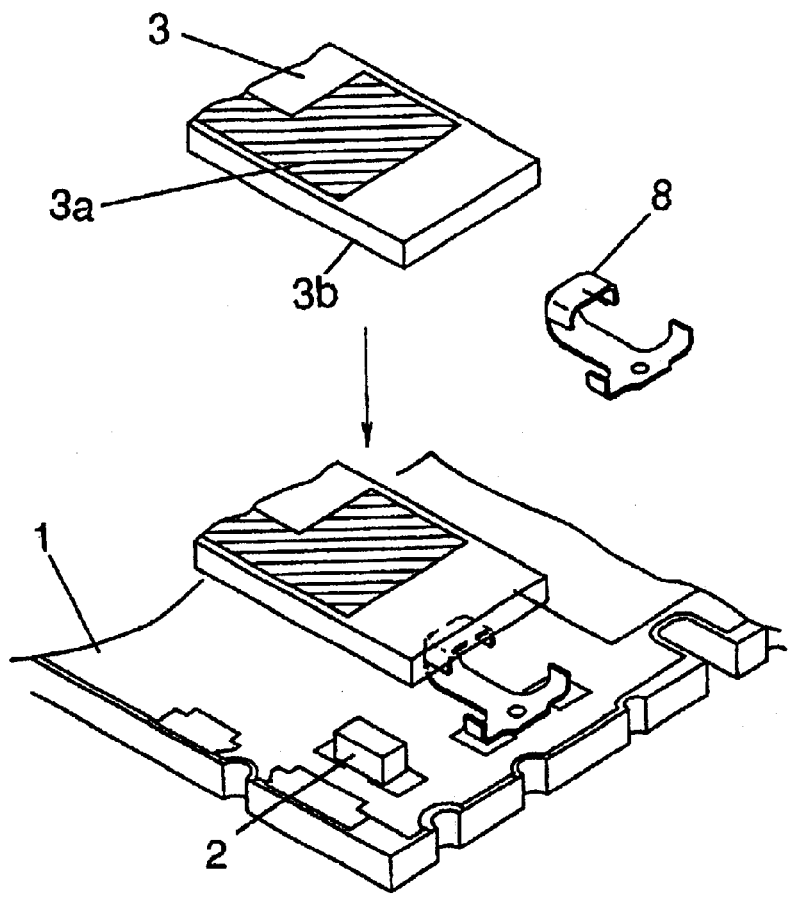
FIG. 17 is a perspective view of a dielectric filter in accordance with another exemplary embodiment of the present invention.
Figure 18:
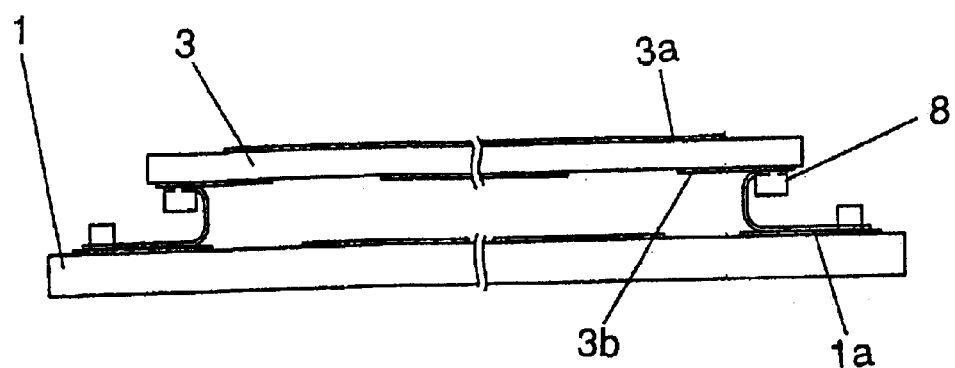
FIG. 18 is a side view of a dielectric filter in accordance with another exemplary embodiment of the present invention.

A fifth exemplary embodiment of the present invention is described with reference to FIG. 16 through FIG. 18.

Also in the present embodiment, a terminal 8 is not designed to hold a joint circuit board. The terminal 8 in the present embodiment is provided at both ends of the connection section 8a with a bent section 8j which is bent towards the connection section 8b, and the connection section 8b is branched. The ends of the branched connection section 8b are bent towards the connection section 8a to form a bent section 8i. An elastic section 8c joints the connection sections 8a and 8b, and is disposed at substantially right angles to either of the connection sections 8a and 8b.

The bent sections 8i and 8j work to prevent a bonding material 9 from spreading wide on an electrode 1a of circuit board 1 and an electrode 3b of coupling board 3, respectively.

Sixth Embodiment

Figure 19:
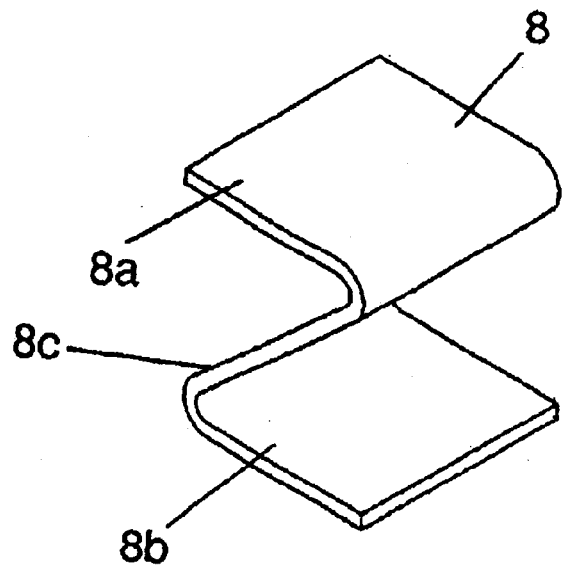
FIG. 19 is a perspective view of a terminal of a dielectric filter in accordance with another exemplary embodiment of the present invention.
Figure 20:
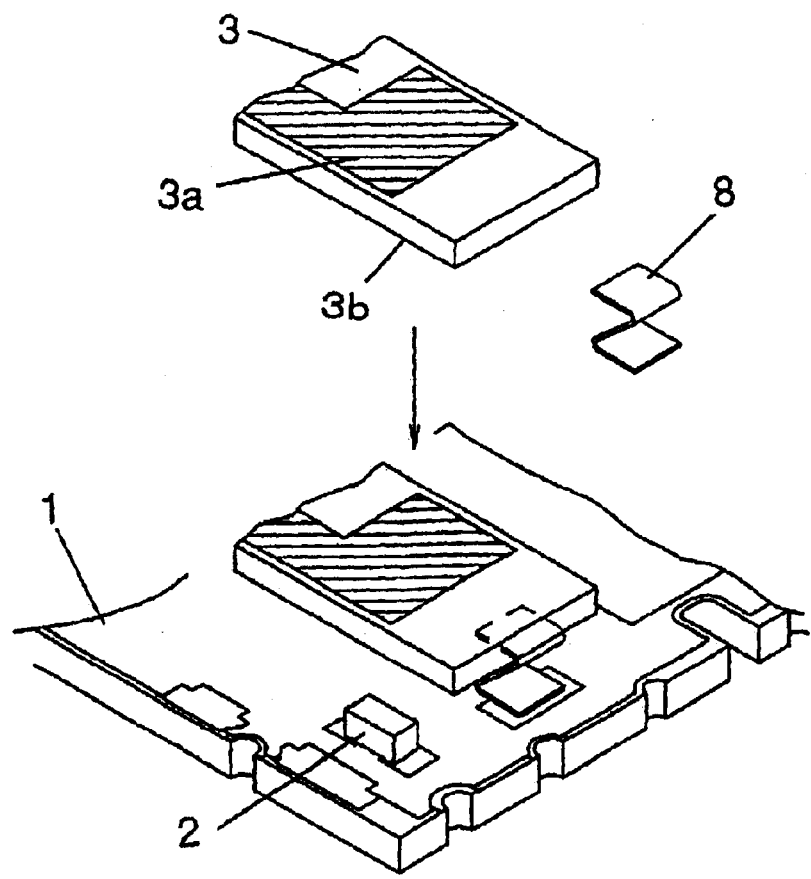
FIG. 20 is a perspective view of a dielectric filter in accordance with another exemplary embodiment of the present invention.
Figure 21:
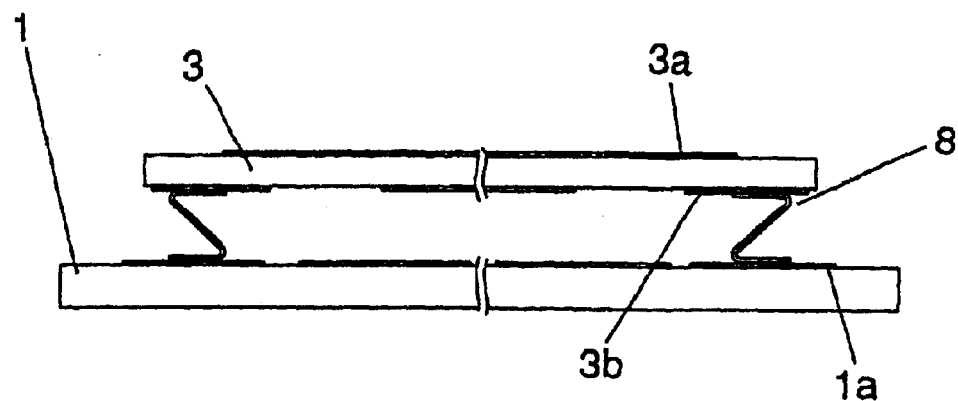
FIG. 21 is a side view of a dielectric filter in accordance with another exemplary embodiment of the present invention.
Figure 22:
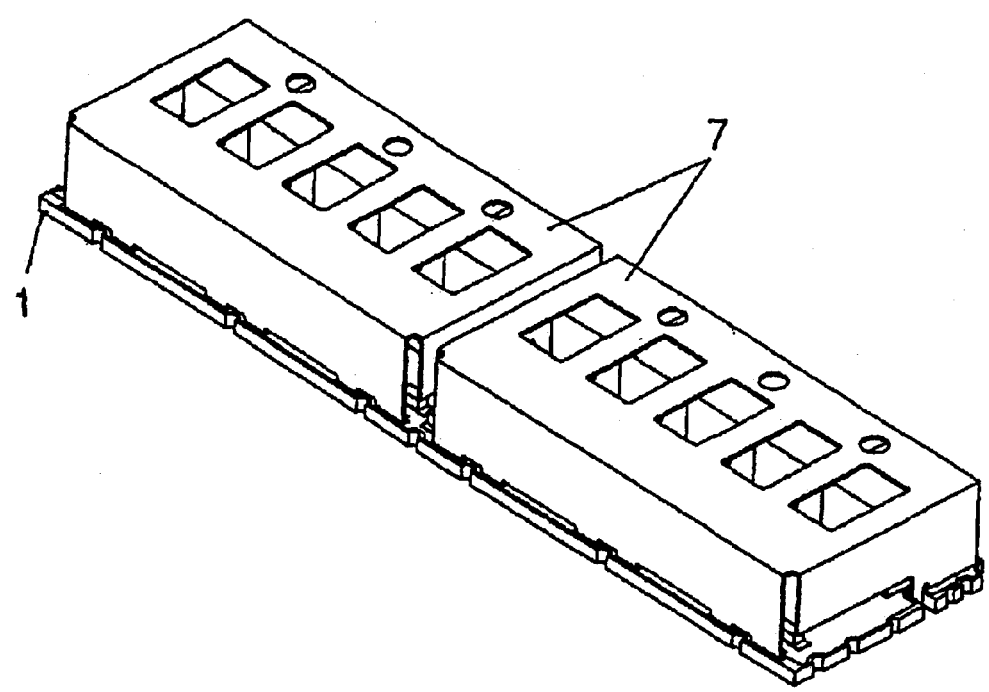
FIG. 22 is a perspective view of a conventional dielectric filter.
Figure 23:
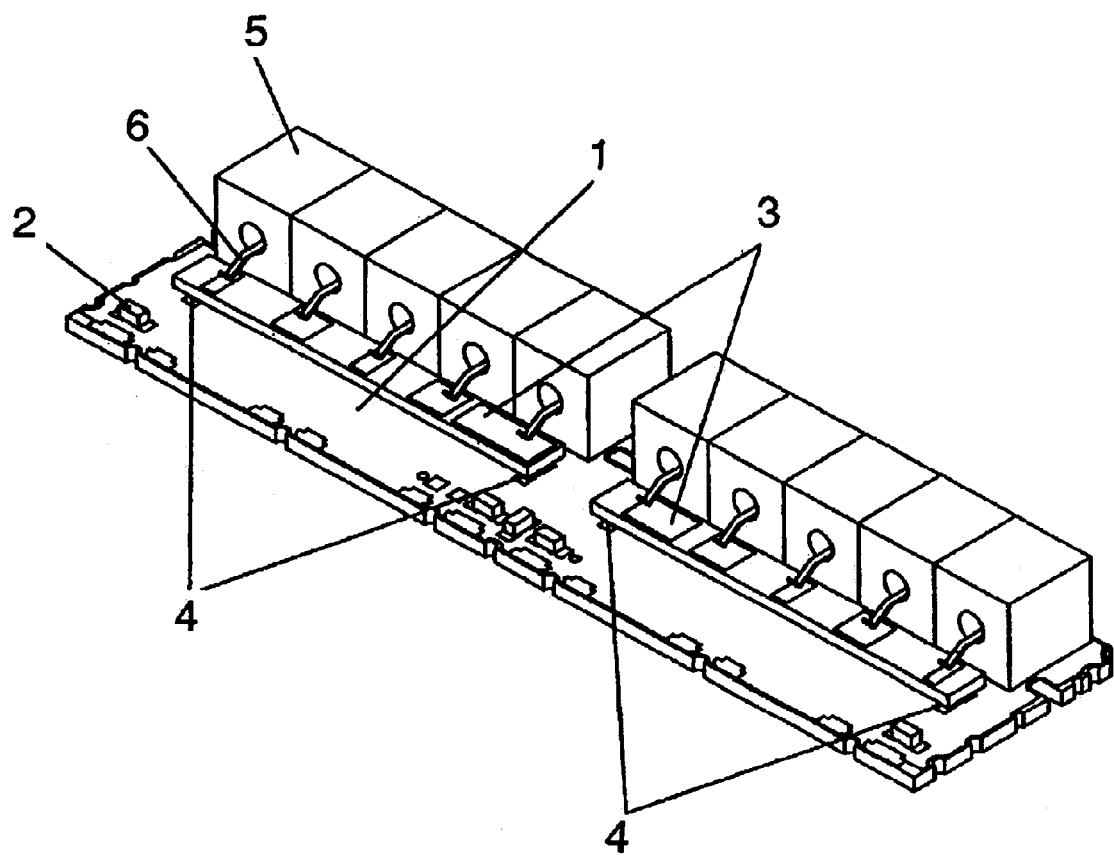
FIG. 23 is a perspective view of a conventional dielectric filter.
Figure 24:
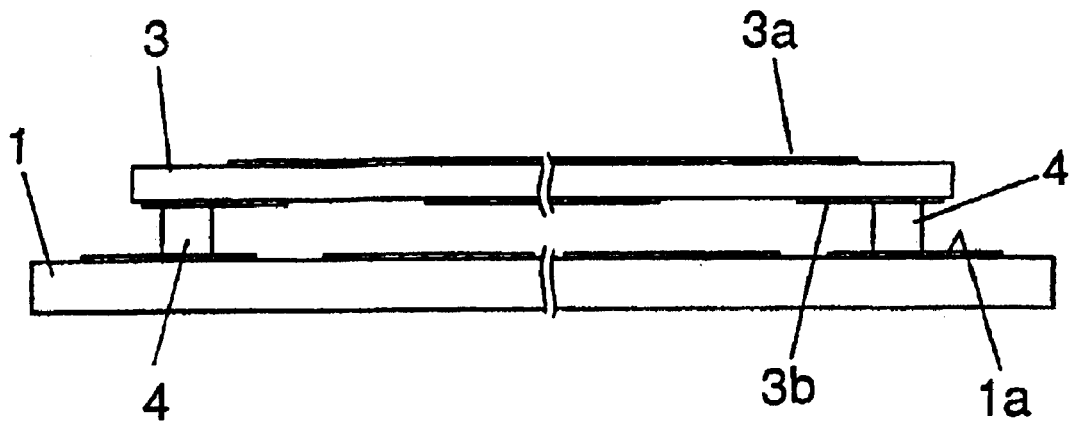
FIG. 24 is a side view of a conventional dielectric filter mounted on a circuit board.

A sixth exemplary embodiment of the present invention is described referring to FIG. 19 through FIG. 21.

Also in the present embodiment, a terminal 8 is not designed to hold a joint circuit board. The shape of the whole terminal 8 represents a letter Z (or a letter S); the connection section 8a and the connection section 8b are disposed in substantially parallel to each other. The connection sections 8a and 8b are jointed by a slant elastic section 8c. Thus the terminal 8 is structured simple and easy to manufacture, so it is advantageous in improving the manufacturing productivity.

As described in the earlier exemplary embodiments, a terminal of the present invention comprises an elastic section 8c disposed between the connection sections 8a and 8b. The elastic section 8c can provide an elastic property (spring property) in itself, or at both ends of it; therefore, it is quite advantageous in the heat cycles or other environments.

Although a dielectric filter has been used as an example of circuit component to which the terminal 8 of the present invention is applicable, use of the terminal 8 is not limited to the dielectric filters. The terminal may be applied also to other electronic components, besides the dielectric filters. Among the dielectric filters, there are other types of filters, for example, a multiplexer, a band pass filter, a band elimination filter, besides the antenna duplexer as illustrated in FIGS. 1, 2 and other drawings.

Although the terminals 8 in the present embodiments have been provided by machining a material of sheet form, they can of course be provided instead by, for example, pressforming a metal bar, bending an elastic metal bar, or by attaching rod form pieces there to.

The examples of the present embodiments reveal their significant advantages when they are applied to the circuit components having large outer dimensions, among other circuit components. Namely, the quantity of shift due to difference in the coefficient of thermal expansion goes larger along with the increasing size of a circuit board 1 and a coupling board 3. The advantage of the present invention becomes significant with such a circuit component which is larger than 60 mm in length L1, larger than 5 mm in height L2 and larger than 15 mm in width L3.

What is claimed is:

1. A circuit component comprising:
    a circuit board; and
    a terminal for mounting said circuit board on a second circuit board,
    wherein,
    a length of said circuit board is 10 mm–80 mm,
    a difference in coefficient of thermal expansion between said circuit board and said second circuit board is $0.2 \times 10^{-5}/°$ C. or greater,
    said terminal is formed of an elastic material, and comprises a first connection section, a second connection section and an elastic section disposed between said first and second connection sections, and
    said terminal separates said circuit board from said second circuit board by 0.3 mm–5 mm.

2. The circuit component of claim 1, wherein said terminal is provided with a holding section for holding said circuit board.

3. The circuit component of claim 1, wherein at least one of said connection sections is comprised of a plurality of connection sections.

4. The circuit component of claim 1, wherein at least one of said connection sections branches out to form a plurality of connection sections.

5. The circuit component of claim 1, wherein one of said connection sections is connected to said second circuit board at an end part of said one of said connection section.

6. The circuit component of claim 1, wherein said elastic section forms substantially right angles to said first and second connection sections.

7. The circuit component of claim 1, wherein said elastic section is slanted relative to said first and second connection sections.

8. The circuit component of claim 1, wherein said terminal is made of one of a sheet-form and rod-shape material having an elastic property.

9. The circuit component of claim 1, wherein said circuit component is a dielectric filter.

10. The circuit component of claim 2, wherein said holding section including at least one of said connection sections is C shaped.

11. The circuit component of claim 4, wherein said plurality of branched connection sections are provided at each of their branched ends with one of a bent section and a protrusion.

12. The circuit component of claim 10, wherein said connection section is provided with a protrusion protruding inward of the C shaped holding section.

13. The circuit component of claim 11, wherein said bent section or protrusion bends or protrudes in a direction away from said circuit board or said second circuit board to which said connection section is connected.

* * * * *